United States Patent [19]

Nadd

[11] Patent Number: 4,796,174
[45] Date of Patent: Jan. 3, 1989

[54] DIRECT VOLTAGE MULTIPLIER CAPABLE OF BEING INTEGRATED INTO A SEMICONDUCTING STRUCTURE

[75] Inventor: Bruno Nadd, Ollieres, France

[73] Assignee: SGS-Thomson Microelectronics S.A., Gentilly, France

[21] Appl. No.: 32,560

[22] Filed: Apr. 1, 1987

[30] Foreign Application Priority Data

Apr. 4, 1986 [FR] France .................. 86 04859

[51] Int. Cl.$^4$ ............................................. H02M 7/25
[52] U.S. Cl. ................................... 363/60; 323/313; 307/296 R
[58] Field of Search .............. 363/59, 60, 62, 63; 323/313, 314; 357/23.6, 51; 365/226; 307/264, 296 R, 296 A

[56] References Cited

U.S. PATENT DOCUMENTS

| | | | |
|---|---|---|---|
| 4,016,476 | 4/1977 | Morokawa et al. | 363/60 |
| 4,559,548 | 12/1985 | Iizuka et al. | 363/60 X |
| 4,641,081 | 2/1987 | Sato et al. | 323/314 X |

FOREIGN PATENT DOCUMENTS 2458936  1/1981  European Pat. Off. .
0134731  3/1985  European Pat. Off. .

OTHER PUBLICATIONS

New Electronics, vol. 18, No. 13, 25 juin 1985, page 25, Londres, GB; G. Peckham: "CMOS driver for high threshold MOSFETS" *En entier*.
Patents Abstracts of Japan, vol. 9, No. 212 (E-339) [1935], 29, aout 1985; & JP-A-60 74 665 (Nippon Denki K.K.) 26-04-1985.

Primary Examiner—Patrick R. Salce
Assistant Examiner—Emanuel Todd Voeltz
Attorney, Agent, or Firm—Oblon, Fisher, Spivak, McClelland & Maier

[57] ABSTRACT

A direct voltage multiplier which can be integrated into a semiconducting structure. The multiplier comprises a capacitor which is charged and discharged at the pace of a clock signal, with a depletion-mode MOS transistor mounted as a resistor and enabling the capacitor to be discharged. The invention makes it possible to integrate the multiplier into a semiconducting substrate and can be used, in particular, to control a VD MOS.

6 Claims, 3 Drawing Sheets

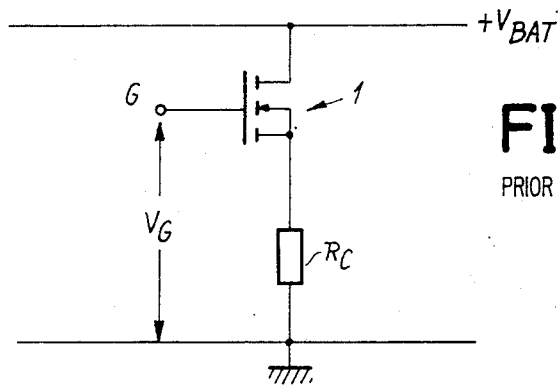
FIG_1 PRIOR ART
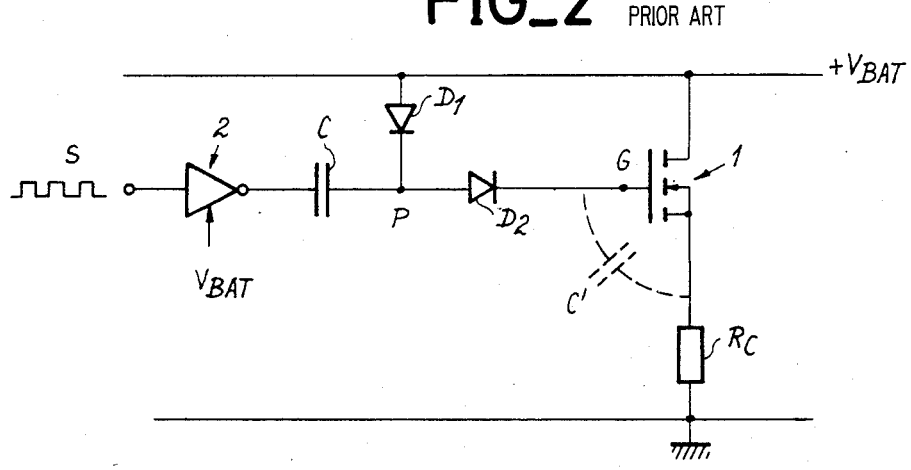
FIG_2 PRIOR ART
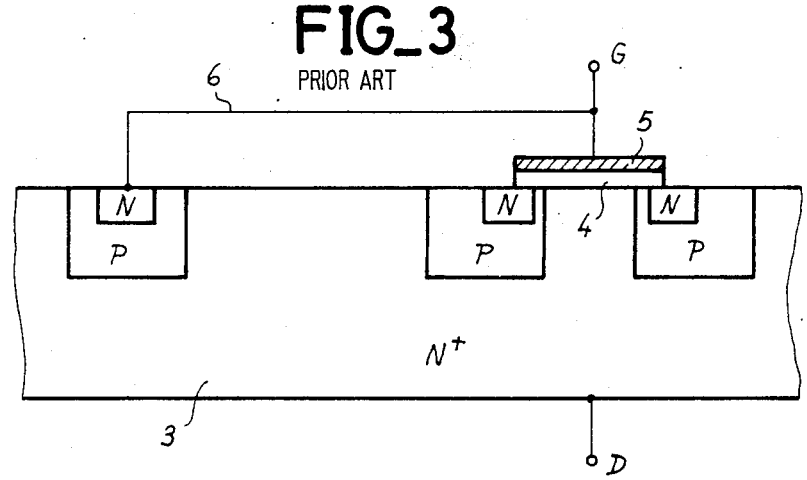
FIG_3 PRIOR ART

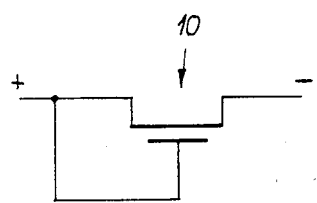
FIG_4
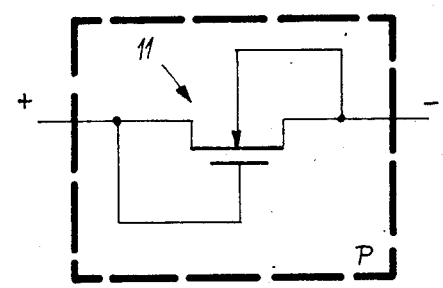
FIG_5
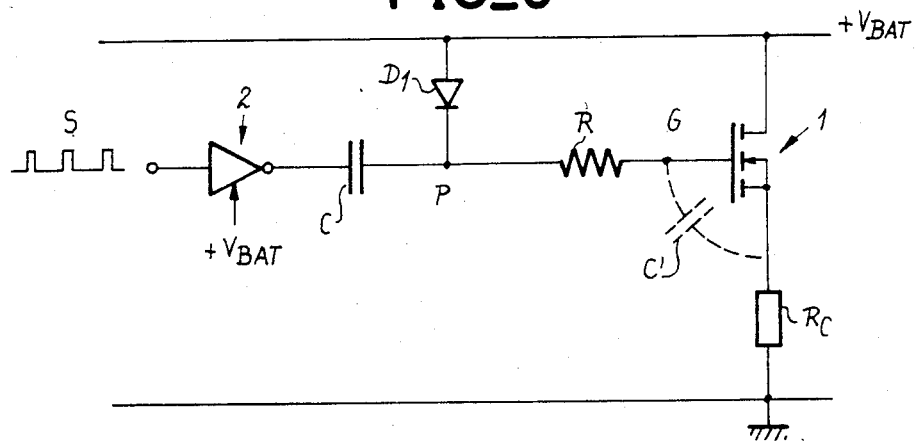
FIG_6
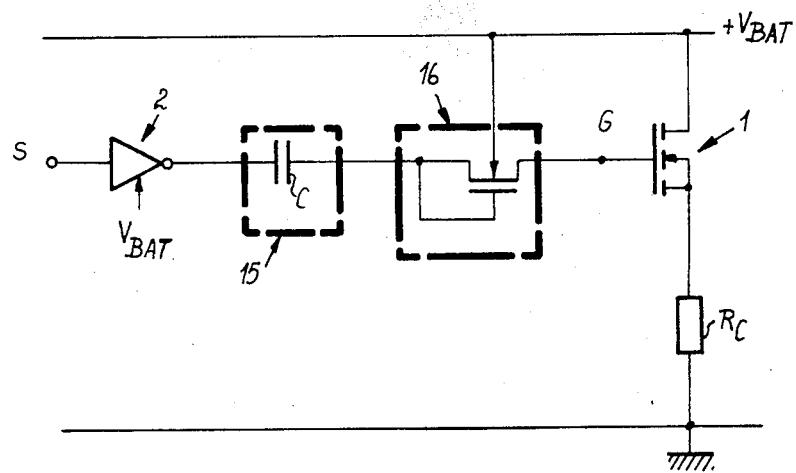
FIG_7

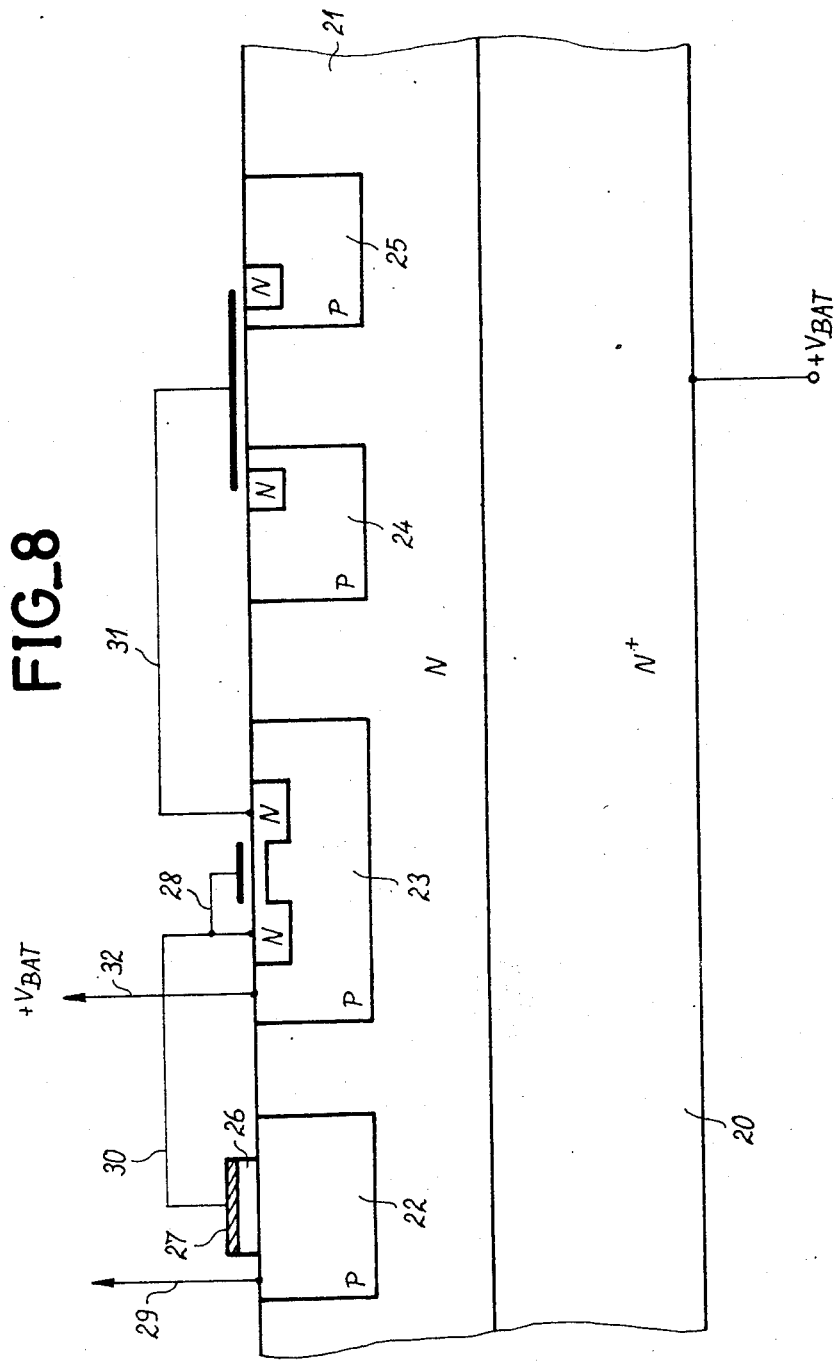
FIG_8

DIRECT VOLTAGE MULTIPLIER CAPABLE OF BEING INTEGRATED INTO A SEMICONDUCTING STRUCTURE

BACKGROUND OF THE INVENTION (1) Field of the Invention

The present invention pertains to a direct voltage multiplier which can be integrated into a semiconducting structure, notably in order to control a power transistor made on a semiconducting substrate.

The growing number of electronics applications in all sectors of industry has led to a proliferation of electric cable lengths. For automobiles especially, the electrical wiring of the various mechanisms is becoming more and more complex, with each of these mechanisms being controlled practically on an individual basis. This wiring generally takes the shape of a harness of wires, of ever-increasing bulk, which it is practically impossible to inspect and repair after assembly. The solution to this problem lies in the use of multiplexing. Since each accessory is capable of recognizing the information that is relevant to it, the accessories can all be connected by one and the same control wire. A multiplexing arrangement of this type results in the association of a power transistor and its control logic on one and the same substrate. One of the problems raised by this new conception of automobile electronics relates to the control of a power transistor in series with a load. In particular, if the power transistor is of the VD MOS (vertical, diffused channel, field-effect transistor) type, the voltage applied at its gate to make it conductive must be greater than the voltage existing between its source and its drain. Since the VD MOS and its load are directly connected to the accumulator battery, there should therefore be a direct voltage which is greater than the battery voltage. Since introducing another source of direct voltage into an automobile is not desired, it is necessary to resort to a voltage multiplier.

(2) Description of the Prior Art

Voltage multipliers are known in the prior art, based on the charging and discharging of a capacitor with control provided by a clock signal. Devices of this type comprise at least two diodes and are made of discrete elements which, therefore, require connecting wires. Since it is sought to avoid using cabling wires as far as possible, the multiplier must be integrated into the same substrate as the VD MOS. To simplify the manufacturing process, it is desirable to make the logic circuit which controls the VD MOS directly in the substrate which acts as the drain for the VD MOS without any special insulation between the region that constitutes the VD MOS and the logic region. It then becomes possible to take advantage of the diffusing operations, which will be used to prepare the VD MOS, to integrate the diodes mentioned above into the substrate. For example, if the substrate is of the N type, the operation in which a P type region is diffused (in order to make the VD MOS channel) could be used also to implant a P type well forming the anode of a diode. The N type diffusion, needed to form the source of the VD MOS, could then be used also to implant an N region, forming the cathode of the diode, in the P well. This solution, which seems attractive, cannot be considered. For it would be impossible to obtain a voltage, greater than the battery voltage, at the VD MOS gate owing to the junction set up between the P well of the diode and the N type substrate which is itself carried to the potential of the battery. One solution to this problem lies in insulating the diode thus created from the substrate. An insulation of this type implies special operations (such as the creation of a buried layer, guard rings, etc.) which cannot be performed at the same time as the VD MOS is being prepared. These additional stages would substantially increase the cost of the semiconducting device In order to reduce these difficulties, the invention proposes to replace the diode driving the gate of the VD MOS by a resistor made from a depletion-mode MOS transistor and to modify the pulse ration of the clock signal so that this resistor behaves like the diode of a conventional multiplying circuit.

It must be noted that the voltage multiplier of the invention has been conceived to resolve a problem pertaining to a particular semiconducting structure. However, the new electrical pattern thus perfected can be used in other applications where a conventional structure would not be appropriate.

SUMMARY OF THE INVENTION

The object of the invention is therefore a multiplier of a direct voltage that has a predetermined value in relation to a reference point, the multiplier comprising at least one cell of the voltage double type, operating by the charging and discharging of a capacitor and controlled by a clock signal, the multiplier being designed to give a control signal to a device that has an input capacity of a determined value, the multiplier comprising:

electronic means by which a first electrode of the capacitor can be set at the potential of the reference point according to the clock signal, a diode linked to the second electrode of the capacitor, providing for the passage of charging current under the effect of the direct voltage of determined value, this charge taking place when the first electrode of the capacitor is set at the potential of the reference point, a resistor linking the common point between the diode and the capacitor to the device to be controlled, wherein also the clock signal has a pulse ratio such that the charging time of the capacitor is smaller than its discharging time.

The resistor linked to the device to be controlled may advantageously be set up by means of a depletion-mode MOS transistor having its gate linked to one of its other two electrodes.

The invention also pertains to the integration of the voltage multiplier into a semiconducting substrate, notably when the device to be controlled is a VD MOS prepared from an N type substrate, the said depletion-mode MOS transistor being made from a first P type well, the capacitor being made from a second P type well.

The first well being carried to the potential of the said direct voltage with a determined value, the said diode would then be made up of the junction between the P type region of the said first well and the N type region of the depletion-mode MOS transistor which is linked to the capacitor.

BRIEF DESCRIPTION OF THE DRAWINGS

The invention will be better understood and other advantages will emerge from the following description along with the appended figures, of which:

FIG. 1 is an electrical diagram representing a VD MOS associated with a load,

FIG. 2 is an electrical diagram comprising a voltage multiplier according to the prior art.

FIG. 3 depicts a semiconducting substrate associating a power transistor and a diode, FIGS. 4 and 5 represent MOS transistors used in the form of diodes, FIGS. 6 and 7 are electrical diagrams comprising voltage multipliers according to the invention, FIG. 8 depicts a semiconducting structure according to the invention.

DESCRIPTION OF THE PREFERRED EMBODIMENTS

FIG. 1 is an electrical diagram representing a VD MOS, marked 1, in series with a load $R_c$. This unit is connected to the terminals of the battery of an automobile, and the load $R_c$ may, for example, represent the headlights of the automobile. To make the transistor 1 conductive, it is necessary to apply, to its gate G, a voltage $V_G$ greater than the drain voltage, i.e. greater than the $V_{BAT}$ voltage. The saturation of the VD MOS is obtained for a voltage $V_G$ which is greater than the drain voltage by about 5 volts. In practice, and for greater safety, it will be assumed that $V_G=V_{BAT}+10$ V. For a 12 V battery, the gate voltage will therefore be 22 V. In the absence of any other source of direct voltage, it is necessary, therefore, to introduce a direct voltage multiplier, and this device must be integrated into the same substrate as the VD MOS.

FIG. 2 represents the electrical diagram of a direct voltage multiplier of the prior art associated with the circuit of FIG. 1. FIG. 2 depicts the capacity C' exiting between the gate and the substrate of the transistor 1. The multiplier comprises two diodes $D_1$ and $D_2$ placed in series between the voltage $V_{BAT}$ and the gate of the transistor 1. A circuit comprising an inverter 2, in series with a capacitor C, is linked to the point P common to the two diodes $D_1$ and $D_2$. The input of the inverter is liable to receive a clock signal S. The operation of the device is as follows. If the clock signal S at the input of the inverter is equal to "1", its output is at the potential of the earth and the capacitor C is charged at $V_{BAT}$. When the clock signal goes to "0", the output of the inverter goes to "1", i.e. to $V_{BAT}$. Then the voltage will enable the conduction of the VD MOS after a succession of charges and discharges of the capacities C and C'. It will be sought to have a low-power inverter. To do this, the capacity of the capacitor C will be sufficiently small in comparison with C'. If the capacity C' is about 10 times greater than the capacity of C, 10 clock pulses will be enough to turn the VD MOS on. For a clock signal of 1 MHz, the headlights, for example, will be actuated within 10 microseconds.

The problem which arises at the outset, in integrating the voltage multiplier into the substrate of the VD MOS, is related to the making of the diode which drives the gate. If the substrate supporting the VD MOS is of the N type, the solution that comes to mind is to make a P well and then to implant an N region to obtain a diode. FIG. 3 depicts a solution of this type. In that part of the N+ type substrate 3 is located on the right-hand side of the figure, a VD MOS has been prepared and is depicted in a simplified way. This transistor comprises two P wells in which implanted N regions have been made. The reference numbers 4 and 5 respectively represent the gate insulating layer and the gate contact. On the left-hand side of the substrate 3, a diode has been made, taking advantage of the P and N implanting operations used to make the VD MOS. The cathode of the diode thus made is joined by a metallization 6 to the gate of the VD MOS so that it complies with the electrical diagram of the FIG. 2. This method appears to be a satisfactory one. However, it would be impossible, with a configuration of this type, to obtain 2 $V_{BAT}$ at the point P. For, since the capacitor C is charged with $V_{BAT}$ by means of a first clock pulse, as soon as the part P of the junction constituting the diode $D_2$ goes above this potential, the junction formed by this part P and by the substrate N+ carried to the drain potential $V_{BAT}$ becomes on. The capacitor C is discharged towards the battery instead of being discharged towards the gate of the VD MOS. The answer to this problem lies in insulating the diode $D_2$ from the rest of the substrate by using known methods (such as wells, buried layers, etc.). But then additional stages are introduced into the manufacturing process. Since these additional stages are undesirable, another method must be looked for.

In the prior art, it is known how to make a diode from a MOS transistor by linking its gate to one of the other two electrodes of the transistor. FIG. 4 depicts a transistor 10 arranged in such a way. The polarities of the equivalent diode are indicated in the figure. However, this solution, in which the same diffusing operations are those of the VD MOS are used, is not possible because of the substrate effect which would prevent the conduction of the diode $D_2$ made from a transistor of this type.

It is also known, in the prior art, to correct this substrate effect by making a diode in the manner shown in FIG. 5. A MOS transistor, marked 11, is prepared in a P well; its gate is linked to its drain and its source is linked to the substrate. This method is not possible either, because the P type well would be directly polarized with reference to the substrate and there would then no longer be any insulation by junction.

The invention proposes to replace this diode $D_2$ by a resistor R as shown in FIG. 6, and to modify the pulse ratio of the clock signal. With a low pulse ratio, the resistor will behave like a diode. The pulse ratio will preferably be chosen such that the charging time of the capacitor is low in comparison with the discharging time of this capacitor towards the gate of the VD MOS. For the capacitor C to be charged as quickly as possible, the output resistance R' of the circuit preceding the capacitor C (in this case the inverter 2) must be low enough in comparison with the resistance R. Proper functioning can be obtained for a value of R' which is about 10 times smaller than R and for a pulse ratio of 10% to 20% for the clock signal S (i.e. the duration of the signal S with a value "1" is 4 to 9 times smaller than the period of this signal).

A practical method to make a resistor on a semiconducting substrate is to use a depletion-mode, N-channel MOS. This transistor will be made from a P well which should be linked to the most positive potential possible, i.e. to the potential $+V_{BAT}$ to minimize the substrate effect. In doing so, it is possible to use one of the two diodes, which exist between the substrate (i.e. the P well) of the depletion-mode MOS transistor and its source and drain electrodes, as the diode $D_1$. The capacitor C can then be obtained from a P well lined with an insulating layer which is itself lined by an electrode. The electrical diagram relating to the semiconducting structure is then the one depicted in FIG. 7. The capacitor C will be obtained from a P well marked 15 and the depletion-mode N MOS will be made from a P well marked 16.

FIG. 8 represents a semiconducting structure in which a power transistor of the VD MOS type is associated with a direct voltage multiplier. This structure has been prepared from a substrate 20 made of N+ doped silicon, the substrate comprising an N−doped epitaxial layer 21. From the epitaxial layer 21, P wells were made in the same operation. The well 22 will act as a support for the capacitor C, the well 23 will act as a substrate for the depletion-mode N MOS transistors and the wells 24 and 25 will be used to prepare the VD MOS. Each of the following operations is known per se. The N type regions of the transistors are implanted during the same operation. The preparation of the transistors does not entail any problem and will not be described in greater detail. On the well 22, a layer 26 of insulating material is deposited followed by a contact 27. The insulating material may be silicon oxide $SiO_2$, and the contact may be made of polycrystaline silicon. Connections will be deposited to connect the gate of the depletion-mode MOS transistor to one of its N type regions (connection 28), the well 22 to the output of the inverter (connection 29), the contact 27 to one of the ends of the resistor formed by the depletion-mode N MOS transistor (connection 30), the other end of the resistor to the gate of the VD MOS (connection 31) and the well 23 to the potential $+V_{BAT}$ (connection 32).

The device according to the invention has the advantage of not requiring any additional operations. The inverter can be integrated without difficulty into the substrate. The above description relates to a structure made from an N type substrate, but it can be easily adapted to a P type substrate.

The structure developed by the invention results from the solution of a series of problems which appeared when it was sought to integrate a direct voltage multiplier into a particular semiconducting substrate. The electrical diagram (the resistor R and particular pulse ratio of the clock signal) on which the invention is based can, however, be used outside the field of semiconductors to resolve specific problems.

What is claimed is:

1. Multiplier of a direct voltage with a predetermined value in relation to a reference point, comprising at least one cell of the voltage doubler type, operating by the charging and discharging of a capacitor and controlled by a clock signal, the multiplier being designed to give a control signal to a device that has an input capacity of a predetermined value, multiplier comprising:
   electronic means by which a first electrode of the capacitor can be set at the potential of the reference point according to the clock signal,
   a diode linked to a second electrode of the capacitor, the diode providing for the passage of charging current under the effect of the direct voltage of predetermined value, this charge taking place when the first electrode of the capacitor is set at the potential of the reference point,
   a resistor linking the common point between the diode and the capacitor to the device to be controlled, the resistor having a resistance and the clock signal having a pulse ratio such that the charging time of the capacitor is smaller than its discharging time, said capacitor charging to said predetermined value of said direct voltage only after application of plural clock pulses of said clock signal.

2. Multiplier according to the claim 1, wherein the resistance of the said resistor is about 10 times greater than the output resistance of the said electronic means, the pulse ratio of the clock signal being such that the charging time of the capacitor is 4 to 9 times smaller than its discharging time.

3. Multiplier according to the claim 1, wherein the resistor linked to the device to be controlled is made by means of a depletion-mode MOS transistor having its gate linked to one of its two other electrodes.

4. Multiplier according to the claim 3, wherein the device to be controlled is a VD MOS made from an N type substrate, the substrate also comprising a first P type well by which the said depletion-mode transistor can be made and a second P type well by which the said capacitor can be made.

5. Multiplier according to the claim 4, wherein the first well is taken to the potential of the said direct voltage with a determined value, the said diode being then formed by the junction that exists between the P type region of the first well and the N type region of the depletion-mode MOS transistor which is linked to the capacitor.

6. Multiplier according to the claim 1, wherein the said electronic means comprise an inverter.

* * * * *